US008259866B2

(12) United States Patent
Chang et al.

(10) Patent No.: US 8,259,866 B2
(45) Date of Patent: Sep. 4, 2012

(54) DECODING SCHEME USING A-PRIORI INFORMATION ABOUT TRANSMITTED MESSAGES

(75) Inventors: Tae Ryun Chang, Santa Clara, CA (US); Jong Hyeon Park, San Jose, CA (US); Ju Won Park, San Ramon, CA (US); Bok Tae Sim, San Ramon, CA (US); Chun Woo Lee, San Ramon, CA (US); Je Woo Kim, Cupertino, CA (US)

(73) Assignee: QUALCOMM Incorporated, San Diego, CA (US)

( * ) Notice: Subject to any disclaimer, the term of this patent is extended or adjusted under 35 U.S.C. 154(b) by 1268 days.

(21) Appl. No.: 11/969,724

(22) Filed: Jan. 4, 2008

(65) Prior Publication Data

US 2009/0175388 A1  Jul. 9, 2009

(51) Int. Cl.
*H03D 1/00* (2006.01)
*H04L 27/06* (2006.01)

(52) U.S. Cl. ........ 375/341; 375/262; 375/265; 375/324; 375/340

(58) Field of Classification Search .............. 375/341, 375/262, 265, 324, 340
See application file for complete search history.

(56) References Cited

U.S. PATENT DOCUMENTS

| | | | |
|---|---|---|---|
| 5,280,489 A | 1/1994 | Fredrickson et al. | |
| 5,910,969 A | 6/1999 | Sayiner et al. | |
| 5,974,091 A * | 10/1999 | Huff | 375/265 |
| 6,532,567 B2 | 3/2003 | Ino | |
| 6,765,507 B2 | 7/2004 | Yokokawa et al. | |
| 6,973,610 B1 | 12/2005 | Xu | |
| 2007/0030926 A1* | 2/2007 | Brown et al. | 375/340 |
| 2008/0034274 A1 | 2/2008 | Song et al. | |
| 2008/0240303 A1* | 10/2008 | Shao et al. | 375/341 |

FOREIGN PATENT DOCUMENTS

| | | |
|---|---|---|
| CN | 1323102 A | 11/2001 |
| CN | 1731686 A | 2/2006 |
| CN | 101059544 A | 10/2007 |
| EP | 1047063 | 10/2000 |
| EP | 1463207 A1 | 9/2004 |
| EP | 2066055 | 6/2009 |

(Continued)

OTHER PUBLICATIONS

He, J.; Costello, D.J., Jr.; Huang, Y.-F.; Stevenson, R.L.: "On the application of turbo codes to the robust transmission of compressed images," Proceedings of the International Conference on Image Processing 1997, vol. 3, pp. 559-562, (Oct. 26-29, 1997) doi: 10.1109/ICIP.1997.632182; XP010253749; ISBN: 978-0-8186-8183-7.

(Continued)

*Primary Examiner* — Ted Wang
(74) *Attorney, Agent, or Firm* — Charles Chesney

(57) ABSTRACT

A method and apparatus for decoding encoded data bits of a wireless communication transmission are provided. A set of a-priori bit values corresponding to known bit values of the encoded data bits may be generated. Decoding paths that correspond to decoded data bits that are inconsistent with the a-priori bit values may be removed from the possible decoding paths to consider, and decoding the encoded data bits by selecting a decoding path from remaining decoding paths of the possible decoding paths that were not removed.

32 Claims, 15 Drawing Sheets

FOREIGN PATENT DOCUMENTS

| | | | |
|---|---|---|---|
| JP | 2003505975 | A | 2/2003 |
| KR | 20050058030 | A | 6/2005 |
| TW | 554617 | B | 9/2003 |
| WO | WO0143309 | A2 | 6/2001 |
| WO | WO2007021224 | | 2/2007 |
| WO | WO2007065115 | A2 | 6/2007 |
| WO | WO2008041309 | | 4/2008 |

OTHER PUBLICATIONS

International Search Report and Written Opinion—PCT/US2009/050695, International Search Authority—European Patent Office—Jun. 1, 2010.

International Search Report—PCT/US08/070362, International Search Authority—European Patent Office, Sep. 4, 2008.

Written Opinion—PCT/US08/070362, International Search Authority—European Patent Office, Sep. 4, 2008.

IEEE 802.16 Working Group on Broadband Wireless Access: "IEEE 802.16 Air Interface for Fixed Broadband Wireless Access Systems," Oct. 1, 2004.

Akay, et al., "High Performance Viterbi Decoder for OFDM Systems," 2004 IEEE 59th Vehicular Technology Conference, 2004. VTC 2004-Spring. Milan, Italy, May 17-19, 2004, pp. 323-327.

Taiwan Search Report—TW097128515—TIPO—Dec. 15, 2011.

* cited by examiner

FIG. 13

| FCH/DLFP MESSAGE FORMAT | | | |
|---|---|---|---|
| FIELD | SIZE (BITS) | NOTES | COMMENTS |
| Bitmap | 6 | Bit(m) corresponding to Major Group m. Value 1 means used by this segment and Value 0 means not used. Example Bit(0)='1' then MG0 is used in this seq. Bit(0:5)='11111' then MG0~MG5 are used | Variable info Predictable info |
| Reserved | 1 | Reserved field. Shall be set to '0' | Fixed info |
| Repetition type | 2 | Indicate repetition type used on DL MAP 0b00: No repetition. Repetition factor 1 0b01: Repetition factor 2 0b10: Repetition factor 4 0b11: Repetition factor 6 | Variable info |
| Coding type | 3 | Indicate coding type used on DL MAP 0b000: TBCC 0b001: BTC 0b010: CTC 0b100: ZTCC 0b100: LDPC 0b101~0b111: Reserved | Variable info Predictable info |
| Length | 8 | Define the length in slots of the DL MAP | Variable info. Predictable info |
| Reserved | 4 | Reserved field. Shall be set to '0000' | Fixed info |

| L0 HYPOTHESIS: API 0BITS/24BITS ||||
|---|---|---|---|
| FIELD | SIZE (BITS) | Resulting API (x is unknown) | COMMENTS |
| Bitmap | 6 | XXXXXX | |
| Reserved | 1 | X | |
| Repetition type | 2 | XX | |
| Coding type | 3 | XXX | |
| Length | 8 | XXXXXXXX | |
| Reserved | 4 | XXXX | |

FIG. 14A

| L1 HYPOTHESIS: API 5BITS/24BITS ||||
|---|---|---|---|
| FIELD | SIZE (BITS) | Resulting API (x is unknown) | COMMENTS |
| Bitmap | 6 | XXXXXX | |
| Reserved | 1 | 0 | |
| Repetition type | 2 | XX | |
| Coding type | 3 | XXX | |
| Length | 8 | XXXXXXXX | |
| Reserved | 4 | 0000 | |

FIG. 14B

| L2 HYPOTHESIS: API 6BITS/24BITS ||||
|---|---|---|---|
| FIELD | SIZE (BITS) | Resulting API (x is unknown) | COMMENTS |
| Bitmap | 6 | 1XXXXX | Seg 0 is identified in preamble |
| Reserved | 1 | 0 | |
| Repetition type | 2 | XX | |
| Coding type | 3 | XXX | |
| Length | 8 | XXXXXXXX | |
| Reserved | 4 | 0000 | |

FIG. 14C

| L3 HYPOTHESIS: API 11BITS/24BITS |||| 
|---|---|---|---|
| FIELD | SIZE (BITS) | Resulting API (x is unknown) | COMMENTS |
| Bitmap | 6 | 111111 | All are used in prev. frame |
| Reserved | 1 | 0 | |
| Repetition type | 2 | XX | |
| Coding type | 3 | XXX | |
| Length | 8 | XXXXXXXX | |
| Reserved | 4 | 0000 | |

FIG. 14D

| L4 HYPOTHESIS: API 13BITS/24BITS |||| 
|---|---|---|---|
| FIELD | SIZE (BITS) | Resulting API (x is unknown) | COMMENTS |
| Bitmap | 6 | 111111 | All are used in prev. frame |
| Reserved | 1 | 0 | |
| Repetition type | 2 | XX | |
| Coding type | 3 | 0X0 | TBCC(0B000) or CTC(0B010) |
| Length | 8 | XXXXXXXX | |
| Reserved | 4 | 0000 | |

FIG. 14E

| L5 HYPOTHESIS: API 15BITS/24BITS |||| 
|---|---|---|---|
| FIELD | SIZE (BITS) | Resulting API (x is unknown) | COMMENTS |
| Bitmap | 6 | 111111 | All are used in prev. frame |
| Reserved | 1 | 0 | |
| Repetition type | 2 | XX | |
| Coding type | 3 | 0X0 | TBCC(0B000) or CTC(0B010) |
| Length | 8 | 00XXXXXX | Assume L< 2^6 |
| Reserved | 4 | 0000 | |

FIG. 14F

| L6 HYPOTHESIS: API 17BITS/24BITS |||| 
|---|---|---|---|
| FIELD | SIZE (BITS) | Resulting API (x is unknown) | COMMENTS |
| Bitmap | 6 | 111111 | All are used in prev. frame |
| Reserved | 1 | 0 | |
| Repetition type | 2 | XX | |
| Coding type | 3 | 0X0 | TBCC(0B000) or CTC(0B010) |
| Length | 8 | 0000XXXX | Assume L< 2^4 |
| Reserved | 4 | 0000 | |

DECODING SCHEME USING A-PRIORI INFORMATION ABOUT TRANSMITTED MESSAGES

BACKGROUND OF THE INVENTION

1. Field of the Invention

Embodiments of the present invention generally relate to wireless communications and, more particularly, to decoding wireless transmissions.

2. Description of the Related Art

The rapid growth in wireless communications services, such as broadband Internet access and streaming media applications, leads to an increasing demand for higher data rates. Advancements in multiplexing schemes, such as Orthogonal Frequency Division Multiplexing (OFDM) and Orthogonal Frequency Division Multiple Access (OFDMA), are important for next generation wireless communications systems. This is due to the fact that such schemes can provide many advantages including modulation efficiency, spectrum efficiency, flexibility (e.g., allowing differentiated quality of service), and strong multi-path immunity over conventional single carrier modulation schemes.

OFDM and OFDMA systems often utilize convolutional encoders at the transmitter to provide for error correction. Using a convolutional code, an m-bit string of data is transformed into n-bits, where m/n is a coding rate. Decoders, such as Viterbi decoders, are used at the receiver to decode the received encoded n-bits to recover the original m-bit sequence. This scheme often allows the original m-bit sequence to be decoded correctly, even if one or more of the encoded n-bits is not received correctly, thus resulting in reductions in bit error rate.

However, with the ever increasing reliability and performance demands of wireless services, there is an ongoing need to continuously reduce bit error rates.

SUMMARY OF THE INVENTION

One embodiment provides a method for decoding encoded data bits of a wireless communication transmission. The method generally includes generating a set of a-priori bit values corresponding to known bit values of the encoded data bits, removing, from a collection of possible decoding paths, decoding paths that correspond to decoded data bits that are inconsistent with the a-priori bit values, and decoding the encoded data bits by selecting a decoding path from remaining decoding paths of the possible decoding paths that were not removed.

One embodiment provides a decoder for decoding encoded data bits of a wireless communication transmission. The decoder generally includes a branch metric unit for calculating branch metrics of the encoded data bits, an add-compare-select unit for selecting, based on the branch metrics, a decoding path for use in generating decoded bits, and logic for removing, from consideration by the add-compare-select unit when selecting the decoding path, one or more decoding paths that correspond to decoded bit values that are inconsistent with a set of one or more a-priori bit values that correspond to assumed values of the encoded data bits.

One embodiment provides a receiver for wireless communication. The receiver generally includes a receiver front end for receiving a wireless transmission and generating a set of encoded bits and a decoder. The decoder is generally configured to decode the encoded bits by removing, from a collection of possible decoding paths, decoding paths that correspond to decoded data bits that are inconsistent with the a-priori bit values and selecting a decoding path from remaining decoding paths of the possible decoding paths that were not removed.

One embodiment provides an apparatus for wireless communications. The apparatus generally includes means for receiving a wireless transmission and generating a set of encoded bits and means for decoding the encoded bits by removing, from a collection of possible decoding paths, decoding paths that correspond to decoded data bits that are inconsistent with the a-priori bit values and selecting a decoding path from remaining decoding paths of the possible decoding paths that were not removed.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 13 illustrates an example message format that may be used to generate decoding hypotheses based on a-priori information bits.

FIGS. 14A-14G illustrate different decoding hypotheses based on a-priori information bits.

DETAILED DESCRIPTION

The present invention generally provides techniques and apparatus for decoding convolutionally encoded wireless transmissions using a-priori information regarding a transmission. The a-priori information may be used to effectively reduce the population of possible decoded bit streams by eliminating those that include bits that are not consistent with the a-priori information. By removing these "known wrong" paths that lead to erroneous data, decoded bit error rates may be improved in some situations.

As used herein, the term a-priori information generally refers to information known beforehand, such as, information proceeding from a known or assumed cause to a necessarily related effect. As will be described in greater detail below, examples of a-priori information related to a transmission include known information bits in certain messages. Examples of such known information bits include reserved bits with values, as specified by a standard, or bits that have known or predictable values based on their value in previous transmissions. These known bit positions and bit values (herein referred to as "API values") may be used in decoding process to improve decoding performance by excluding paths that correspond to values that are in contrast to the API values.

An Example Environment

Figure 1:
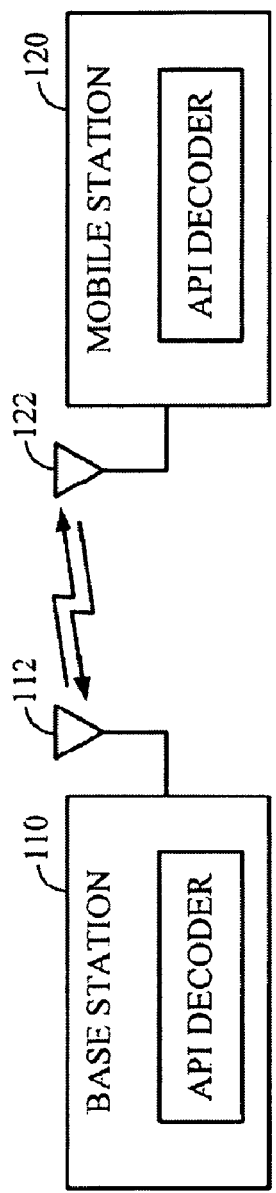
FIG. 1 illustrates an example system in accordance with an embodiment of the present invention.

FIG. 1 illustrates an example system in which embodiments of the present invention may be utilized to process a wireless signal from a base station 110 to a mobile station 120. The base station 110 may be a wireless communications station installed at a fixed location, such as a cellular telephone tower. The mobile station 120 may be any suitable type user equipment (UE) capable of communicating with the base station 110, such as a cellular handset or other type mobile device.

The base station 110 and mobile station 120 may communicate using one or more antenna 112, 122, each, and using any suitable wireless communication technology employing modulation schemes, such as orthogonal frequency-division multiplexing (OFDM) and orthogonal frequency division multiple access (OFDMA). For some embodiments, the communications between the base station and mobile station may be partially or fully compliant with a variety of Institute of Electrical and Electronics Engineers (IEEE) standards, such as IEEE 802.16 (Worldwide Interoperability for Microwave Access-WiMAX) and 802.20 (Mobile Broadband Wireless Access-MBWA) family of standards.

In some applications, the base station 110 may transmit data to the mobile station over what is commonly referred to as a forward link, while the mobile station 120 transmits data to the base station 120 over a reverse link. As will be described in greater detail below, different types of a-priori information may be available for forward and reverse link transmissions. This a-priori information may include information regarding the timing and content of certain messages between the base station 110 and mobile station 120, which may result in the value of one or more bits in a transmission being known.

The techniques described herein may be utilized in decoding performed at the base station 110, mobile station 120, or both. As will be described in greater detail below, a-priori information about different types of messages transmitted between the base station 110 and 120 may be used to determine the value of particular bit locations with in a transmission.

Figure 2:
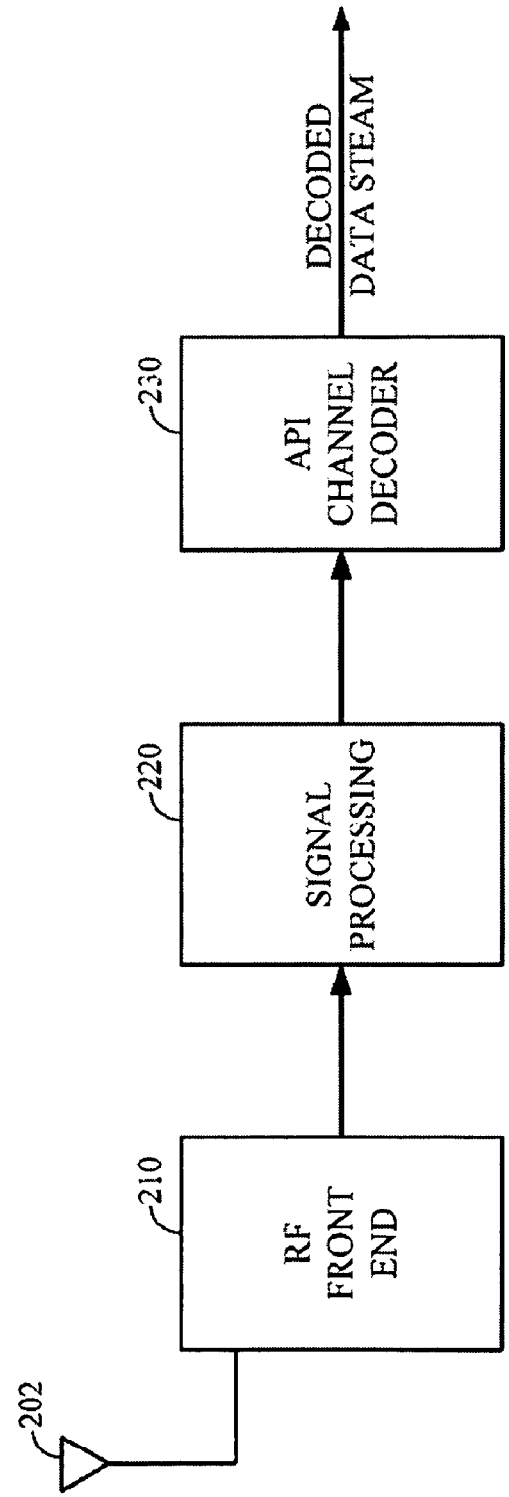
FIG. 2 is a block diagram of a receiver capable of a-priori decoding in accordance with an embodiment of the present invention.

FIG. 2 illustrates a block diagram of example components for one embodiment of a receiver capable of receiving the transmitted signals. One or more antenna 202 may receive transmitted signals from a transmitter and send them to a radio frequency (RF) front end 210. The RF front end 210 may include any suitable circuits for receiving the transmitted signals and preparing them for digital signal processing, such as automatic gain control (AGC), a fast Fourier transform (FFT) block, a channel estimator, and a carrier-to-interference-and-noise ratio (CINR) estimator.

Signals from the RF front end 210 may then be sent to a signal processing block 220, which may contain any suitable circuits for subcarrier de-allocation, signal demapping, and the like. The output of the signal processing block 220 is a set of encoded bits. The encoded bits are forwarded to a channel decoder 230, which may decode the encoded bits using a-priori information about the corresponding transmission.

A-Priori Decoding

Figure 3:
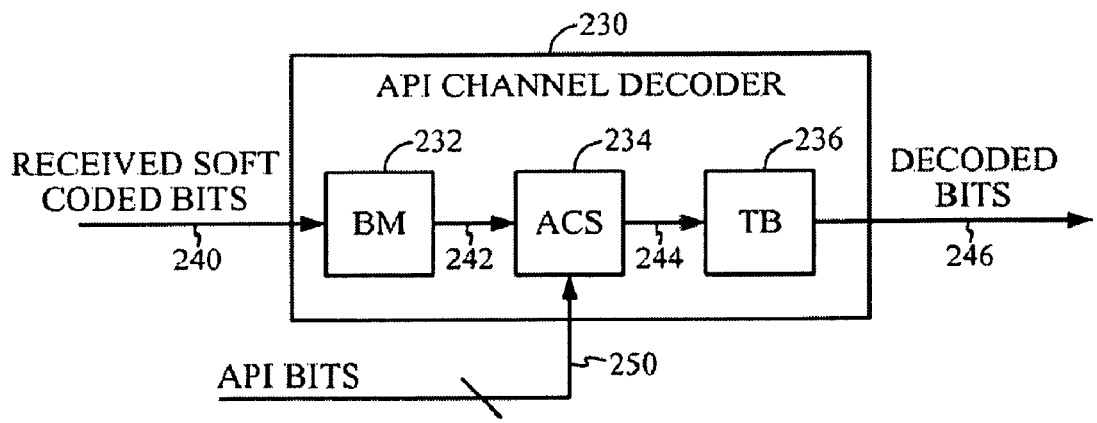
FIG. 3 is a block diagram of an a-priori decoder in accordance with an embodiment of the present invention.

FIG. 3 is a block diagram of a decoder 230 capable of performing decoder operations based on a-priori information in accordance with an embodiment of the present invention. While the illustrated example shows a Viterbi decoding scheme as an example, the a-priori decoding techniques presented herein may also be applied to other type of decoding schemes, such as Turbo coding/decoding, low-density parity-check (LDPC) coding/decoding, RS coding/decoding, BCH coding/decoding, and various other schemes.

In the case of schemes that utilize systematic codes, coded bits may include systematic bits (information before encoding) and parity bits (redundancy bits resulting from encoding). API decoding scheme may be applied to the systematic bits. In other words, API bit values may include known values of the systematic bits based on the particular systematic codes used. To apply API for systems utilizing systematic codes, bits of received data may be replaced with (known/predicted) API bit values at the front end of the decoder. In this manner, the probability of successful decoding may be increased using API for systematic decoders.

The decoder 230 includes a branch metric unit 232, add compare select (ACS) logic 234, and a traceback (TB) unit 236 to generate a set of decoded bits 246 from a set of "soft (or hard)" received/encoded bits 240. The branch metric unit generally functions to calculate branch metrics, which represent normalized distances between a received symbol (set of bits) and symbols in a code alphabet. The ACS unit 234 generally compiles branch metric data to generate metrics for decoding paths (2K-1 paths, assuming a constraint length of K) and selects one of these decoding paths as optimal. The results of these selections are written to memory of a traceback unit 236, which restores a path from the stored decisions. A set of decoded bits can then be generated based on the transitions of the restored path.

One or more of the decoder components may be controlled by a set of API bits 250 in order to prevent the selection of decoding paths that correspond to bit values that are inconsistent with the a-priori information. In other words, the API bits 250 may contain sufficient information to indicate particular values ("0" or "1") that are known for certain bit locations in a sequence of bits being decoded. Any bit string that has a value other than the value specified in the API bits 250 is not a valid decoded bit string. Thus, the decoder may remove decoding paths corresponding to these invalid bit strings from consideration during path selection.

Figure 4:
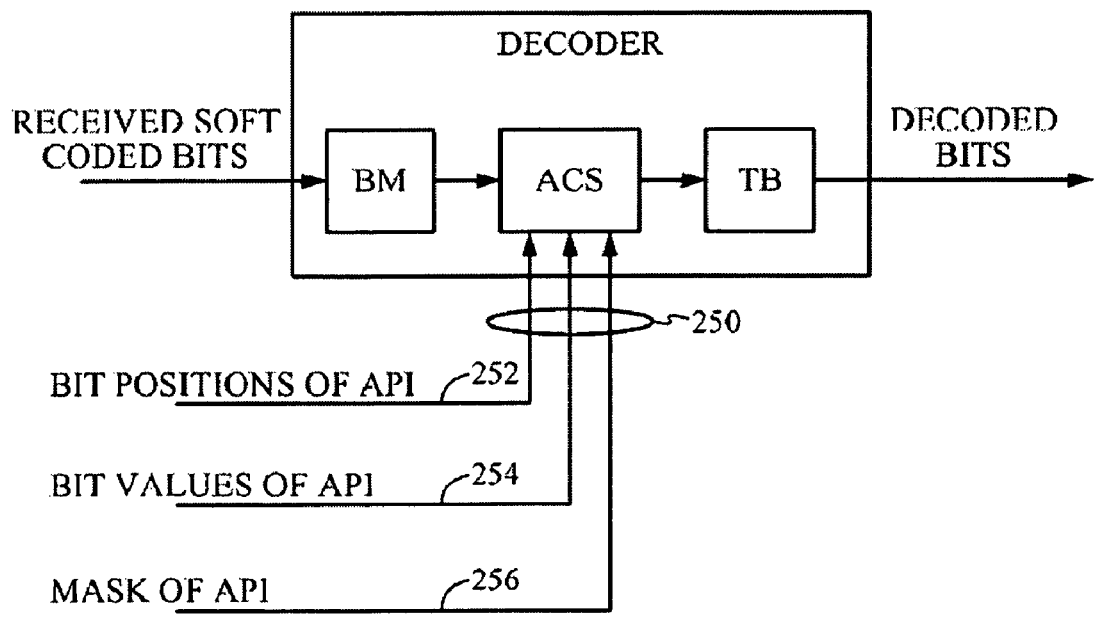
FIG. 4 is a block diagram of an a-priori decoder illustrating an example of a-priori information (API) bits in accordance with an embodiment of the present invention.

As illustrated in FIG. 4, for some embodiments, the ACS unit 234 may be controlled by API bits 250 in order to exclude decoding paths that correspond to invalid decoded bit strings. During ACS operation, the API bits 250 may be used to reduce particular decoding path transitions that correspond to encoded bit values that are inconsistent with the API values.

The API bits 250 generally include sufficient information to identify one or more bits in a decoded bit string that have bit values that are known (or predictable) based on a-priori information and, additionally, what those bit values are. The actual format in which this information is conveyed may vary with different embodiments and according to actual implementation schemes.

Figure 7:
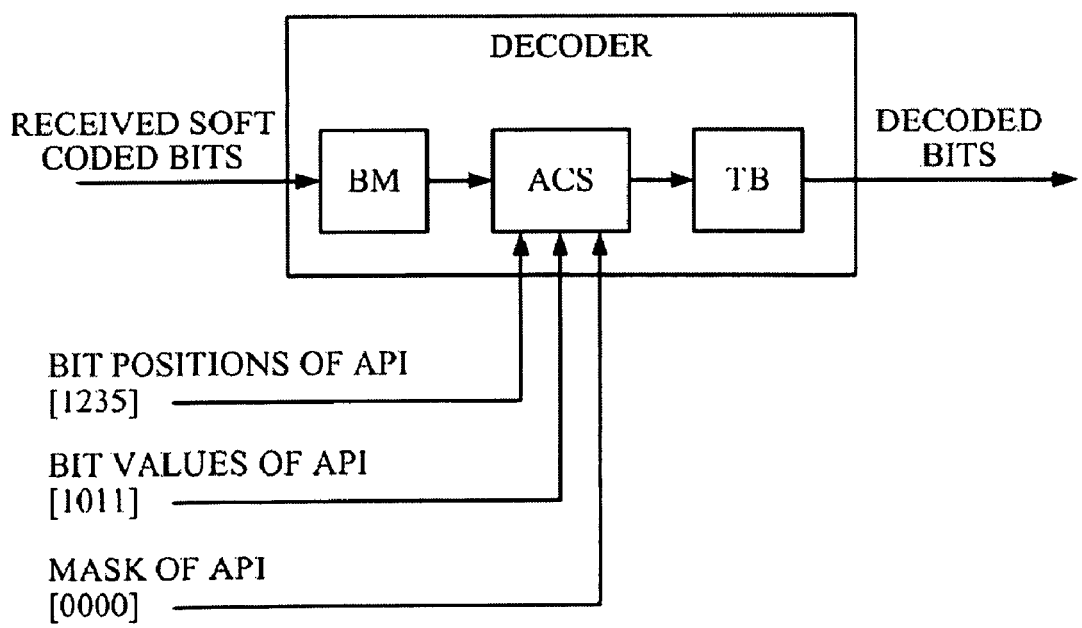
FIG. 7 illustrates the decoder of FIG. 5 with example values of a-priori information bits.

For example, for some embodiments, the API bits 250 may include three types of information: an indication of bit positions 252, bit values 254, and, optionally, API mask bits 256. The bit positions 252 may provide an indication of bit locations (within an encoded sequence) that have known values, while the bit values 254 provide the actual known values ("0" or "1") of an encoded bit. FIG. 7, described in detail below, provides an illustration with example values for bit positions, bit values, and mask bits according to this format.

The API bit positions 252 may identify bit positions correspond to the position of a known/predicted encoded bit in trellis structure. According to one embodiment, the API bit positions 252 may explicitly identify bit positions that have known values, while all other bit positions are considered "unknown." The corresponding bit value of "0" or "1" in the bit values 254 may thus be used to identify valid transitions in the trellis structure and effectively remove decoding paths involving invalid transitions.

Figure 5:
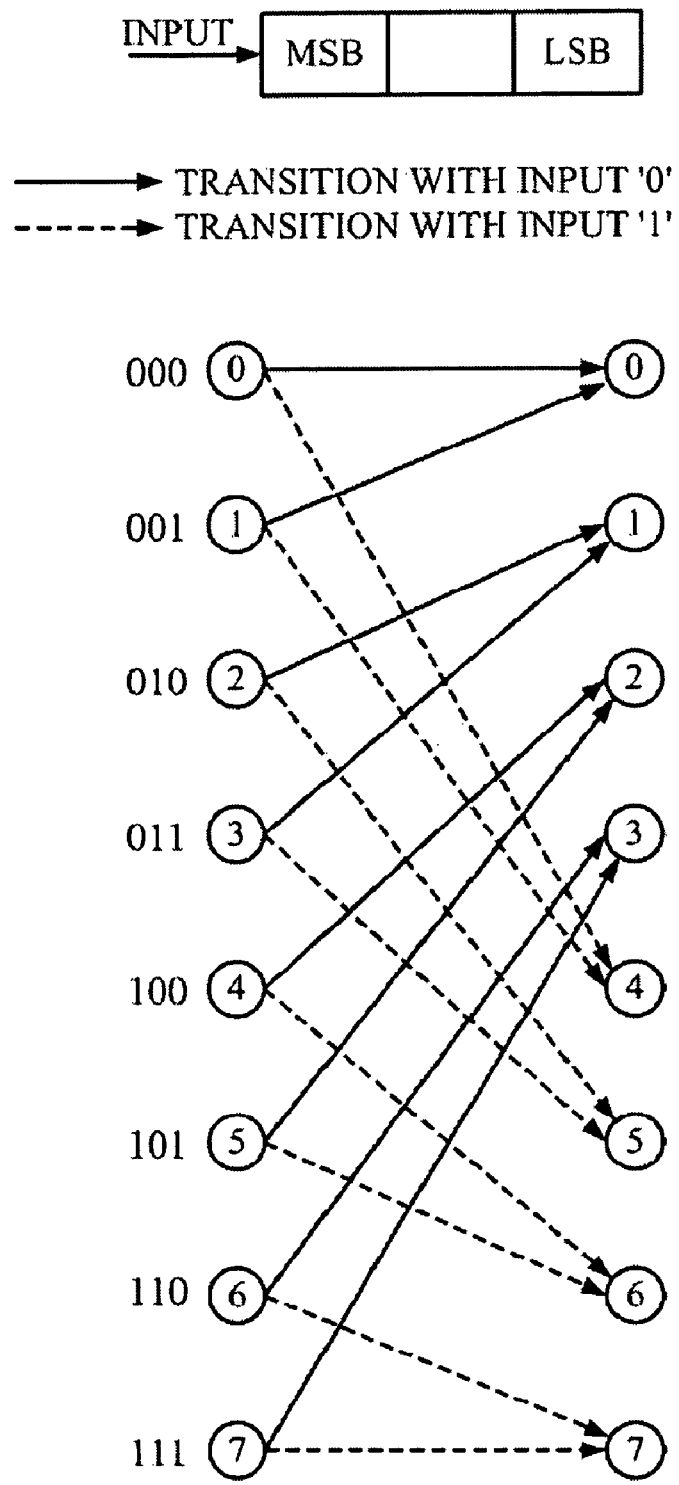
FIG. 5 illustrates an example of a state transition of a trellis diagram in accordance with an embodiment of the present invention.

For example, FIG. 5 illustrates an example of a state transition of a trellis structure with 3-bit states. The illustrated example assumes a coding rate of ½ and a K=4 (with a 3-bit, K-1, state register). Solid arrows indicate state transitions corresponding to a "0" input bit, while dashed arrows indicate state transitions corresponding to a "1" input bit. According to API decoding, state transitions that correspond to input bits that are inconsistent with known values may be eliminated from consideration, thereby effectively eliminating any paths including these transitions from the final selection.

As an example, if a known API bit value for this state were a "0," the state transitions with solid lines will be evaluated, while the state transitions with dashed lines do not need to be calculated because they are part of invalid paths that should not be considered for selection. As described above, these transitions may be effectively eliminated at the next transition by setting the value of a state metric to a worst case value. In addition to reducing bit error rate by eliminating invalid paths from selection, eliminating the number of transitions based on API bit values can also reduce the number of computations in the ACS unit.

For some embodiments, a mask function may be realized by utilizing the API mask bits 256 to identify bit positions whose API bit value should be ignored. Such a mask function may be useful and add flexibility, for example, when a standard changes causing a previously known bit value to become unknown. Setting the mask bit may provide a simple mechanism to efficiently accommodate such changes. A mask function may also be realized by manipulating the API bit positions 252 to remove the identification of a bit position that no longer has a known value, thus providing an alternative to changing a value in the bit mask value and/or eliminating the need for the bit mask value at all.

Figure 6:
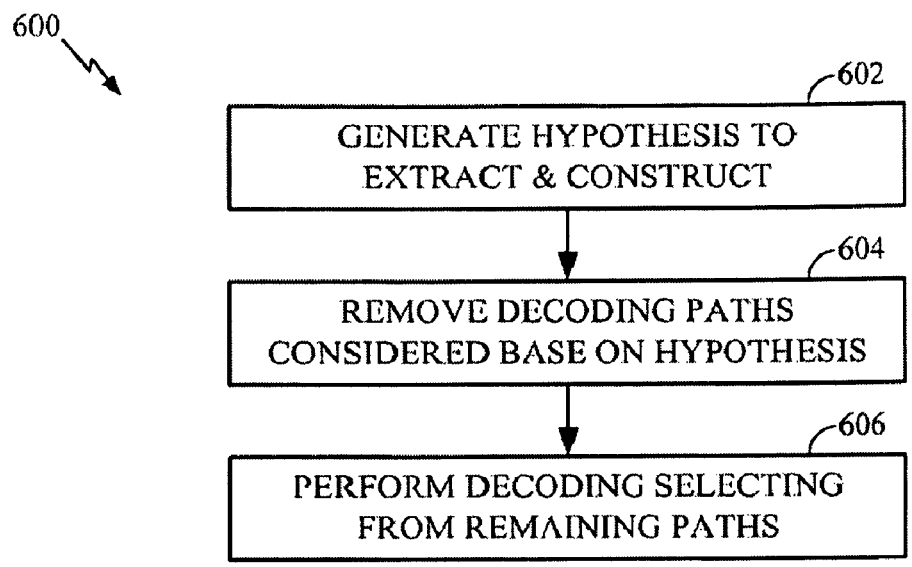
FIG. 6 is a flow diagram of example operations for a-priori decoding in accordance with an embodiment of the present invention.

FIG. 6 illustrates example operations 600 for API decoding. The operations begin, at 602, by generating a hypothesis based on a-priori information. At 604, decoding paths that result in bit values inconsistent with the API bit values of the hypothesis are removed. Finally, at 606, decoding is performed based on a selection of one of the remaining paths.

As used herein, the term hypothesis generally refers to a particular set of API bits, for example, indicating bit positions with known values and specifying the values for those bits. As will be described in greater detail below, for some embodiments, separate logic (referred to herein as a "hypothesis engine") may be provided to generate one or more hypotheses, for example, based on message information from a MAC processor.

FIG. 7 illustrates one example of a hypothesis for a 6-bit stream applied to an API decoder. The illustrated hypothesis indicates, via API bit position values [1 2 3 5], that API bit values are present at bit positions 1, 2, 3, and 5 for use in decoding. According to the illustrated scheme, the corresponding API bit values [1 0 1 1] indicate the bit values for bits at these positions are: bit1=1, bit2=0, bit3=1, and bit5=1. For some embodiments, API mask bit values of [0 0 0 0] may be used indicate that no masking function is applied to any of the bits. On the other hand, to exclude a bit from the API decoding, a mask bit could be set, for example to [0 0 0 1] to mask bit position 5, resulting in effective bit values of [1 0 1 X].

Of course, API mask functionality may be realized by controlling the API bit position values, as well. As an example, bit position 5 may also be effectively masked out by removing 5 from the bit position values, resulting in bit position values of [1 2 3], with corresponding API bit values [1 0 1]. In this scheme, API bit positions may be effectively masked without the need for a separate mask value data structure.

In an alternative scheme, only the API bit values and corresponding API mask values may be used. As an example, it may be assumed that all positions in a bit sequence are used for API decoding, for example, by default or by express indication of all bit positions in the API position value (e.g., [1 2 3 4 5 6]). In either case, the API mask values may be used to identify bit positions that have no corresponding API bit values. For example, the API mask value of [0 0 0 1 0 1] may be used with the "1" values indicating the API bit values corresponding to bit positions 4 and 6 should be ignored, resulting in corresponding API bit values of [1 0 1 X 1 X].

Figure 8:
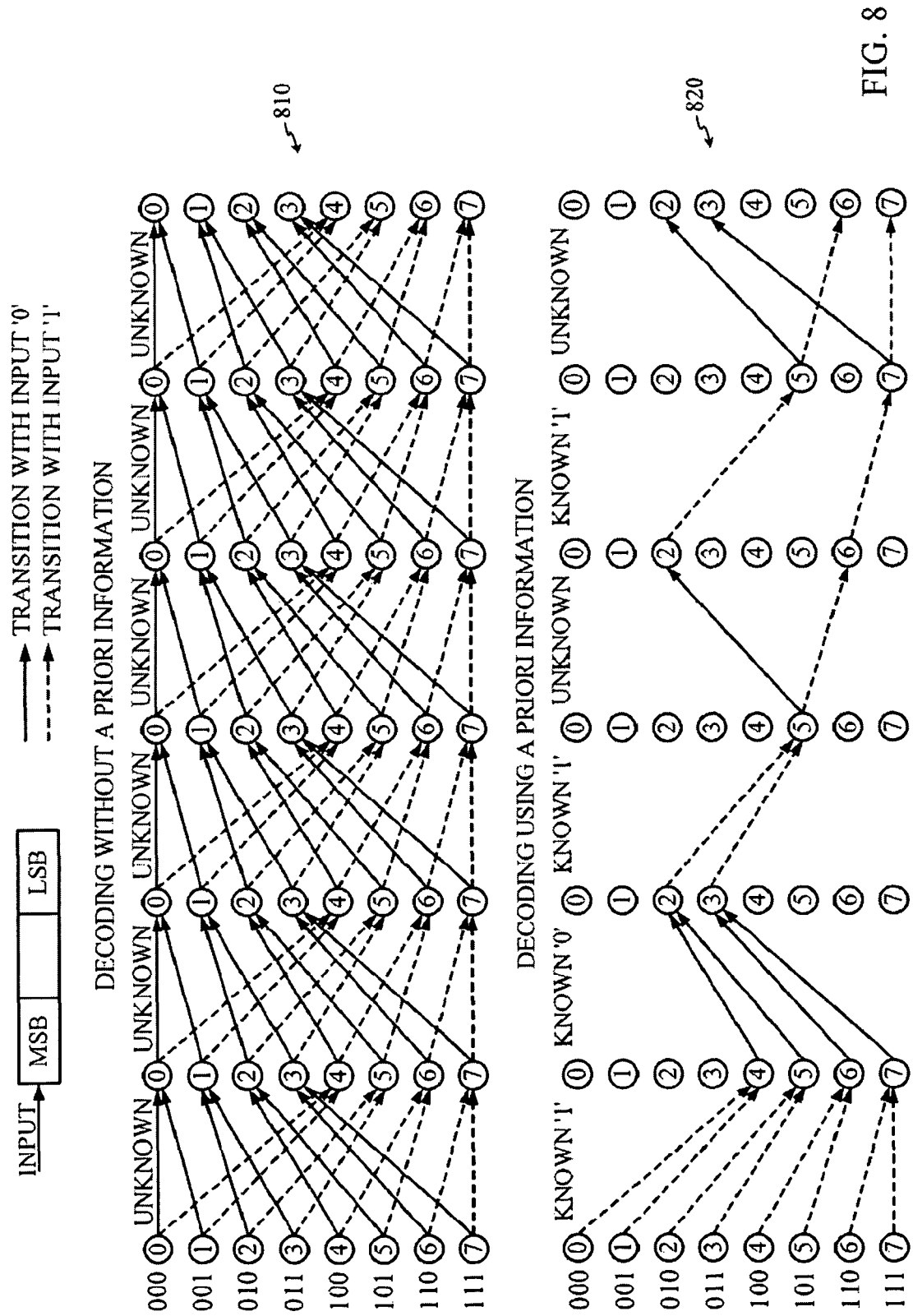
FIG. 8 illustrates an example of a Trellis diagram with a full set of decoding paths and a set of decoding paths that has been reduced based on a-priori information bits, in accordance with an embodiment of the present invention.

FIG. 8 illustrates how the API bit values of the hypothesis shown in FIG. 7 may be applied to reduce the number of decoding paths considered during decoding. The top diagram 810 shows all possible paths through the diagram that would be considered in a conventional decoding scheme that assumes all input bits are unknown. As illustrated by the bottom diagram 820, however, an API decoding scheme searches a greatly reduced number of paths, having eliminated a number of path transitions based using the known API bit values.

The reduction in paths based on the API bit values may be explained by traversing the diagram 820 from left to right. The known API values for the corresponding transitions are listed across the top. For the first transition, the bit value is a known "1" resulting in removal of the solid line path transitions corresponding to a zero input bit. This results in transitions to state nodes 100*b*, 101*b*, 110*b* and 111*b*.

The second transition corresponds to a known bit value of "0" resulting in removal of the dashed line path transitions. This results in transitions to state nodes 010*b* and 011*b*. The third transition corresponds to a known bit value of "1" resulting in removal of the solid line path transitions. This results in transitions to a single state node 101*b*.

The bit value for the fourth transition, however, is unknown. Therefore, both possible transition paths are evaluated. This results in transitions to state nodes 010b and 110b. The fifth transition corresponds to a known bit value of "1" resulting in removal of the solid line path transitions. This results in transitions to state nodes 101b and 111b. The bit value for the sixth transition is again unknown. Therefore, both possible transition paths are evaluated, resulting in transitions to state nodes 010b and 110b from state node 101b and transitions to state nodes 011b and 111b from state node 111b.

Branch metrics for these remaining paths can be evaluated to select an optimal path and generate the corresponding set of decoded bits. By eliminating decoding paths that correspond to invalid bit sequences, bit/packet error rates may be improved using API decoding, with greater improvements expected in noisier environments.

Figure 9:
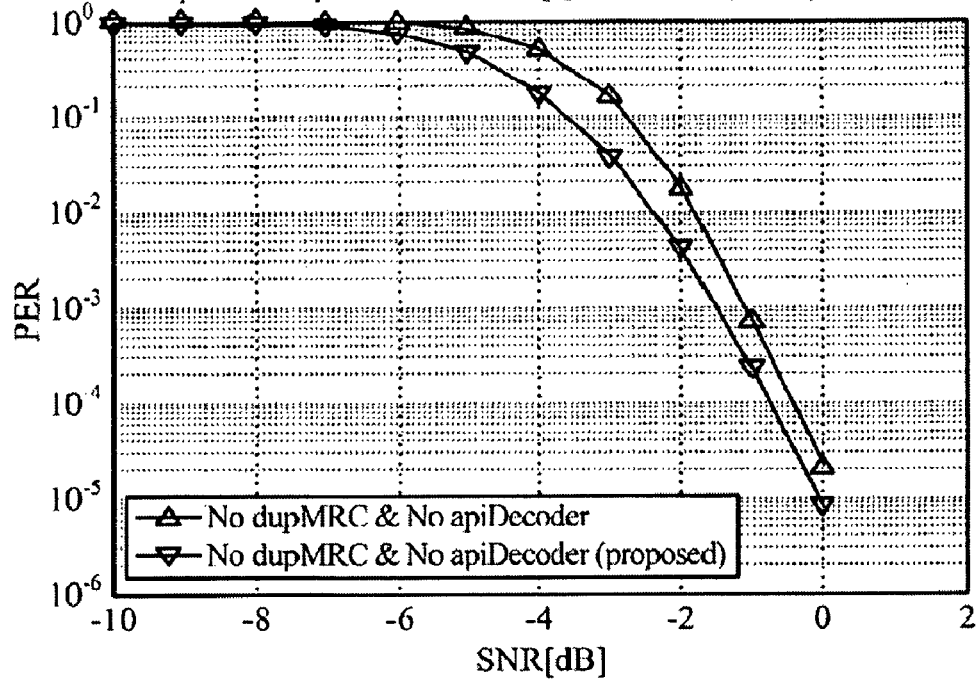
FIG. 9 illustrates example results of decoding considering a first set of a-priori information, in accordance with an embodiment of the present invention.

FIG. 9 is an example graph of packet error rate (PER) versus signal to noise ratio (SNR) for simulated decoding a frame control header (FCH)/downlink frame prefix (DLFP) message of IEEE 802.16e standard. This type of message contains 24 bits information. Of these, 5 bits are reserved bits that are to be set to zero per the standard. In the simulated example, these 5 reserved bits are used as a-priori information, with known bit values of "0" at the corresponding locations in the 24 bit string. The simulation also assumes modulation and coding as follows: QPSK, TBCC(r=½), with a repetition factor of 4 and a duplication factor of 2, and assumes repetition Maximum Ratio Combining (MRC) on the receive side (RX).

As illustrated, the API decoding scheme shows improved performance relative to the conventional decoding scheme in additive white Gaussian noise (AWGN) environments. For example, the API decoding scheme shows about a 0.6 dB gain in PER 10-2 in AWGN channel when compared with conventional decoding (without considering API).

Figure 10:
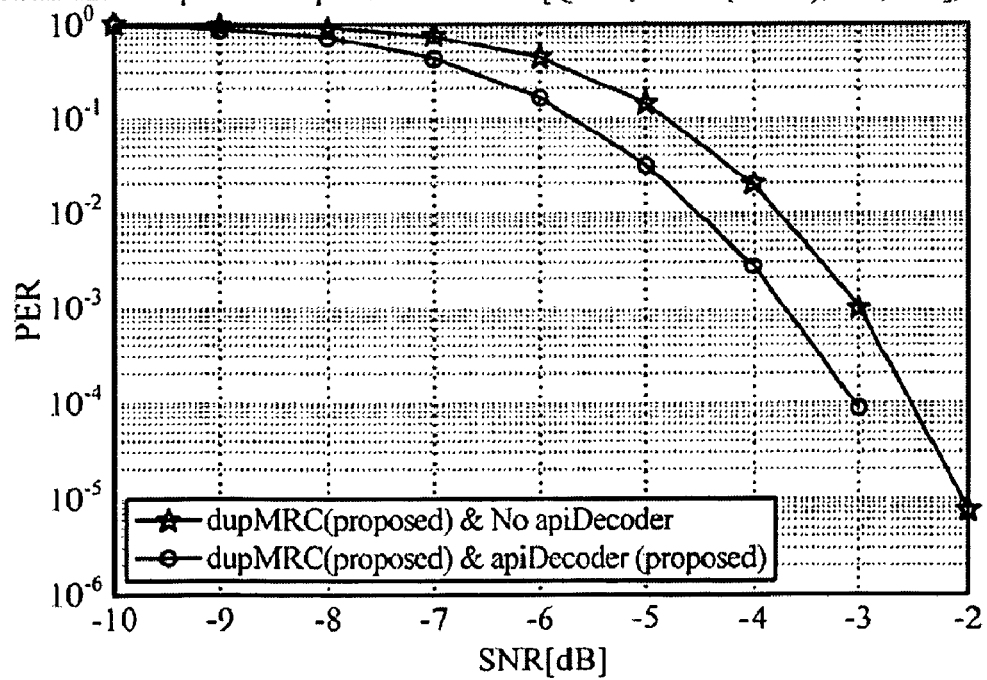
FIG. 10 illustrates example results of decoding considering a first set of a-priori information, in accordance with an embodiment of the present invention.

FIG. 10 is a similar diagram to FIG. 9, but the corresponding simulation assumes both repetition Maximum Ratio Combining (MRC) and duplication on the receive side (RX). As illustrated, in this example, an API decoding scheme shows an approximate 0.75 dB gain at PER 10-2 in AWGN channel compared to without API decoding scheme.

Hypothesis Engine

As described above, for some embodiments, a hypothesis engine may be provided to generate "hypotheses" that each includes a set of API bit values to use in performing API decoding. Depending on a particular implementation, a hypothesis engine may generate a single hypothesis or multiple hypotheses that may differ in which bits have known values and what those bit known values are. Evaluating multiple hypotheses may be useful, for example, when there are only a limited number of valid bit combinations, for a given sequence.

Figure 11:
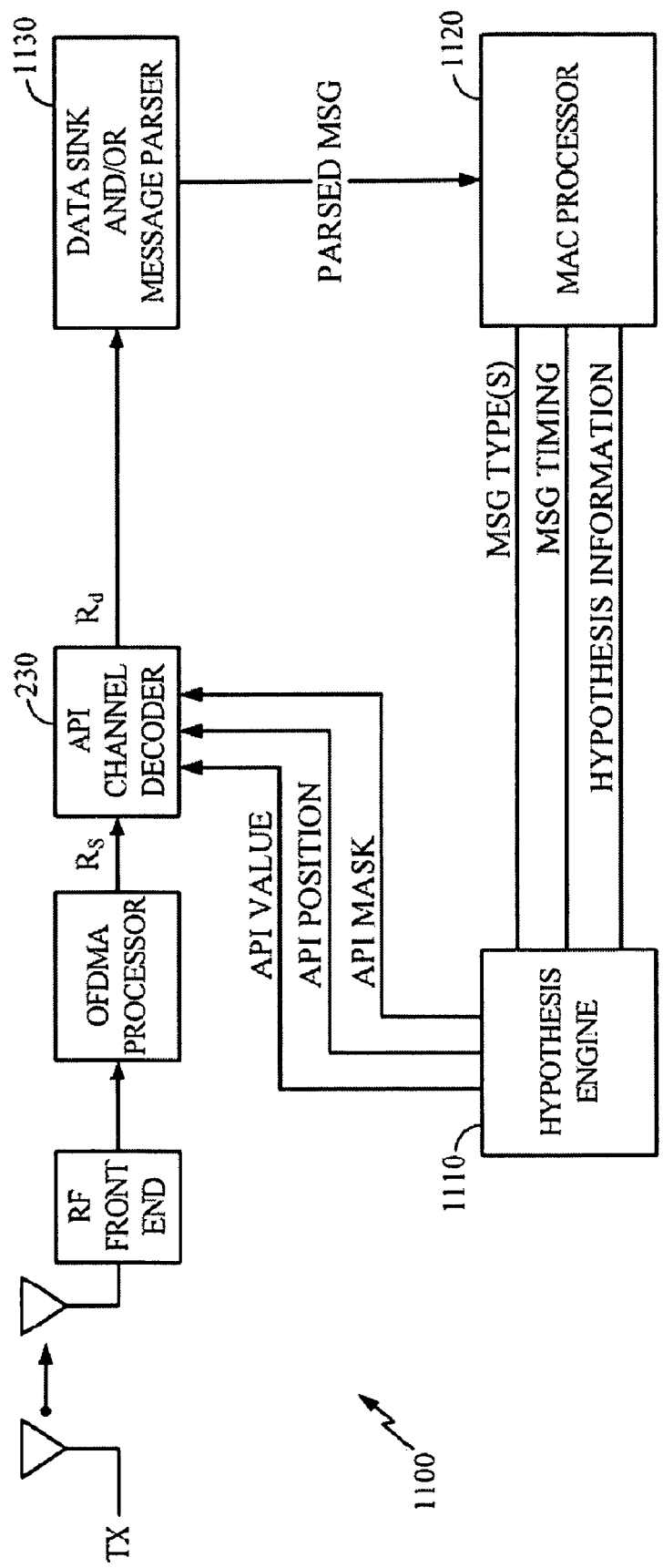
FIG. 11 is a block diagram of a receiver with an a-priori decoder and hypothesis engine in accordance with an embodiment of the present invention.

FIG. 11 illustrates a receiver circuit 1100 that includes an API decoder 230 and a hypothesis engine 1110. As illustrated, the hypothesis engine 1110 may receive information regarding a message from a medium access control (MAC) processor 1120 and generates API bit values (a hypothesis) for use by the API decoder 230. The API decoder 230 starts to decode received soft (or hard) bits Rs using the API bit values provided by the hypothesis engine 1110. The API decoder 230 outputs decoded data bits Rd, which are delivered to a message parser 1130.

If the message parser 1130 detects that the decoded bits are for a kind of message, the message is parsed and delivered to a MAC (medium access control) processor 1120. The MAC processor 1120 may function as a type of protocol analyzer, analyzing the received data, for example, in an effort to determine what the next possible message type(s) are and what the timing will be.

As an example, the MAC processor 1120 may recognize the first incoming message (or data) will be FCH/DLFP message, which is followed by a downlink preamble. In some cases, the MAC processor 1120 may use some information from a previous frame, for example, to determine a coding rate, message length, or some other parameter. The MAC processor 1120 may provide this information to the hypothesis engine 1110 that will use it to extract known bit values (or predict bit values) for particular bit locations and generate API information to forward to the API decoder.

Figure 12:
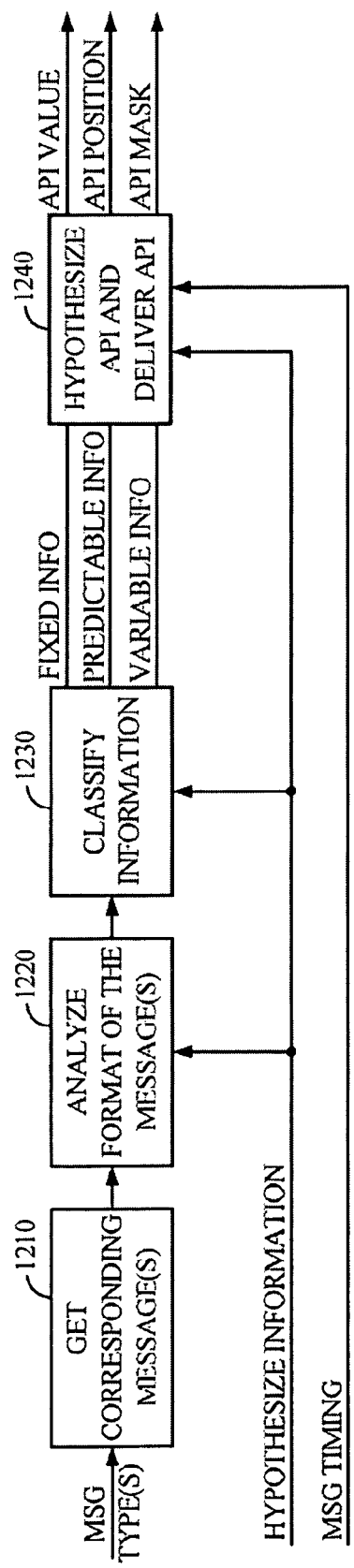
FIG. 12 is a block diagram of a hypothesis engine in accordance with an embodiment of the present invention.

FIG. 12 illustrates an example hypothesis engine 1110 that may be used to generate decoding hypotheses based on a-priori information and message information provided by the MAC processor 1120. As illustrated, the hypothesis engine receives an indication of a message type and includes logic 1210 to retrieve the corresponding message(s) designated by the message type and the format of the message(s) are analyzed by format logic 1220.

For some embodiments, in addition to bit locations with fixed/known bit values (such as reserved bits set to a known value according to a standard), hypotheses may be generated with information that is predictable. As an example, bit information may be predictable based on a value from a previously received message (e.g., a coding type may not likely change from one message to the next).

Thus, classify logic 1230 may classify bit information in a given message into at least three categories: fixed information, predictable information, and variable information. The fixed (known) information generally refers to information that is fixed so that it is known 100% from initial stage or some bit values that are known under some conditions (e.g., after checking the decoding results of related messages). For example, the decoded results of messages relating to data to be decoded, such as messages or data that are known to be positioned before the data to be decoded, may be analyzed and API information may be extracted from the analyzed data.

The predictable information may include information that can be predictable under certain conditions or assumptions so it could provide different candidate values or bit combinations for a set of one or more bits. Different candidate values may be included in different hypotheses. For example, the predictable information may include some information predictable under certain conditions or assumptions or information that is predictable after checking decoding results of related messages.

Variable information generally includes information that is unknown or too difficult to predict so it is generally not used as API bit values (e.g., the API bit position values for these bit locations may be set to "0"). After classifying the information bits, Hypothesis API and Delivery logic 1240 of the hypotheses engine may generate a set or sets of API bit values (each set corresponding to a hypothesis) using the classified information. For example, the logic 1240 may construct the API bit location, bit value, and mask strings, to be output to the decoder 230.

The API decoding scheme presented herein may be applied to a variety of different types of messages. For example, API decoding may be applied to frame control header (FCH) Downlink Frame Prefix (DLFP) messages, as described below, Normal DL map messages, Compressed DL MAP messages, UL MAP messages, Bandwidth Request (BW-REQ) messages, Initial Ranging Request (IRNG-REQ) messages, and so on.

A frame control header (FCH) Downlink Frame Prefix (DLFP) message 1300, as depicted in FIG. 13, provides a good example of various bits of information that may be classified as fixed, predictable, and variable. The format and content of a FCH message is defined in IEEE 802.16e OFDMA standard. The DLFP is the contents of an FCH channel. The DLFP is a data structure transmitted at the beginning of each frame and contains information regarding the current frame and is mapped to the FCH. Therefore, successful decoding of the DLFP is very important to process a whole frame. The classification of some bits may change over time, for example, after a transition from an initial acquisition state to detecting a first message frame.

As an example, a bitmap field 1310 includes 6 bits, with each bit indicating whether a corresponding message group is used by a segment. In an initial acquisition state, these bits are unknown. However, after initial decoding and identifying a message segment, at least one of the bits will be identified (e.g., assuming the first message group bit is used API bits="1XXXXX"). Further, in a normal operation state, the mobile station can predict all 6 of the bits, assuming the base station sends the same bitmap as in the previous frame.

As described earlier, bits of the reserved fields 1320 and 1322 will remain fixed so long as the standard is not changed. In contrast, the 2 bits of the repetition type field 1330 are difficult to predict and can change from frame to frame.

The 3-bit coding type field 1340 may be classified in different ways and used to generate a number of different hypotheses. For example, without placing any conditions on the types of coding, the 3-bit field could be treated as variable. However, using a-priori information some of these bits may be treated as fixed. For example, if it is known that a current version of WiMAX supports only two types of coding, TBCC (0b000) and CTC (0b010), the first and third bits may be treated as known bit values of "0" (API bits="0b0X0").

While the 8-bit length field 1350 may vary from frame to frame, some of the bits may be classified in different manners. As an example, imposing no limitation on the length field all 8 bits would be variable. However, in most cases, a length of a DL-MAP will be less than 2^7, such that the MSB may be predicted to be a "0" (API bits="0b0XXXXXXX"). While this prediction may not be true, the improvement in bit error rate achieved may outweigh any performance penalty in having to re-decode using a different hypothesis. More aggressive hypotheses may also be generated in a similar manner, for example, assuming the length is less than 2^6 (API bits="0b00XXXXXX") or less than 2^4 (API bits="0b0000XXXX").

FIG. 14A-14G illustrate multiple API decoding hypothesis examples for the FCH/DLFP message, based on the information and possible classifications and assumptions described above. The hypotheses are referred to as having different levels (L0-L6) that generally represent how "aggressive" the hypothesis is, based on the number of bits that are treated as having known bit values.

Referring first to FIG. 14A, the L0 hypothesis corresponds to the case of no API bit values (no hypothesis), as in the case of the first message in each frame. In other words, because a message has not been decoded, there is no message information that may be used to generate API values. FIG. 14B illustrates the first level (L1) hypothesis, with only the reserved bit values used in the hypothesis.

FIG. 14C illustrates the L2 hypothesis, which includes the reserved bit values plus a bitmap bit value (the message group indicated in the first frame) used in the hypothesis. FIG. 14D illustrates the L3 hypothesis which, relative to the L2 hypothesis, adds the remaining bitmap bit values that were used in the previous frame.

FIG. 14E illustrates the L4 hypothesis which, relative to the L3 hypothesis, adds coding field bit values that are common to the supported coding types TBCC and CTC. FIG. 14F illustrates the L5 hypothesis which, relative to the L4 hypothesis, adds the upper two bits of the length field based on the assumption the length is less than 2^6. FIG. 14G illustrates the L6 hypothesis which, relative to the L5 hypothesis, adds two more bits of the length field, based on the assumption that the length is less than 2^4.

The bit values for each of these hypotheses may be used by the API decoder to reduce a number of decoding paths that correspond to erroneous data, in the manner described above. Of course, the hypotheses shown in FIGS. 14B-14G are exemplary only. Further, while the illustrated hypotheses get progressively more aggressive, including more known bit values, those skilled in the art will recognize that other hypotheses may be generated using different combinations of the bit values shown in these examples.

Figure 15:
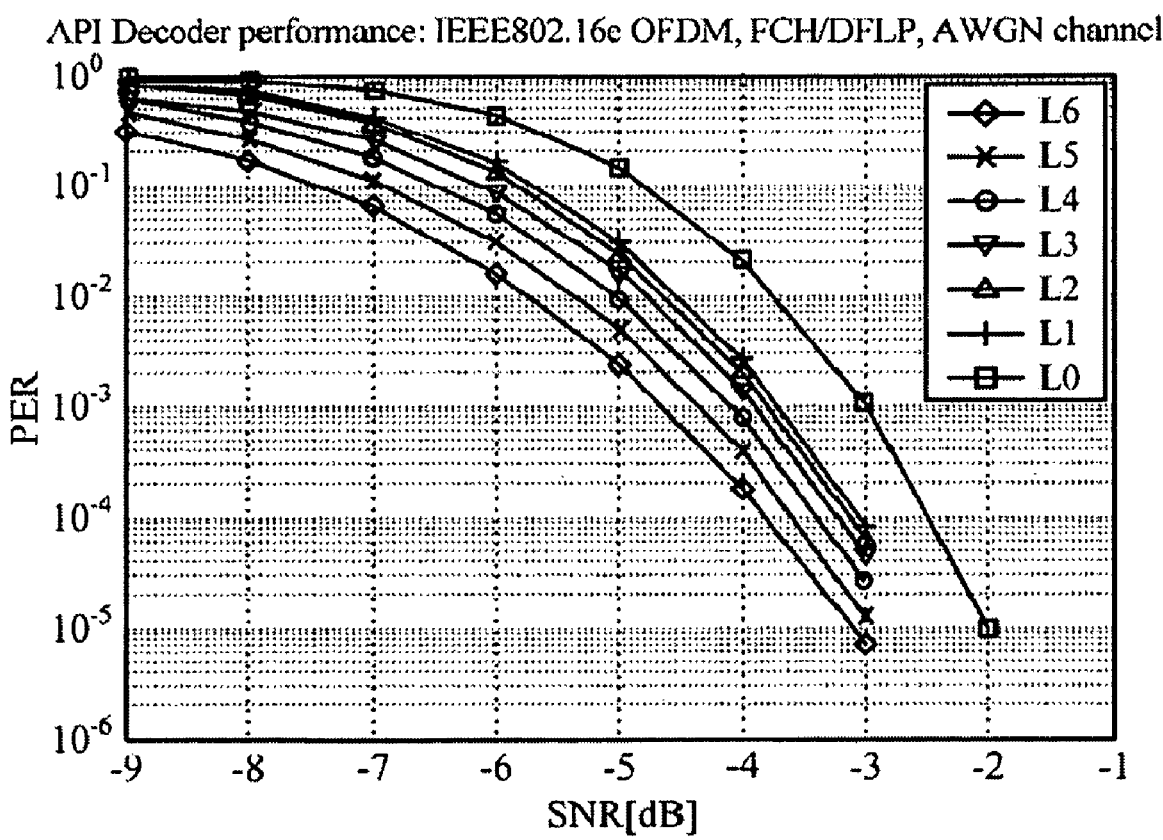
FIG. 15 illustrates example results of decoding for different API hypotheses, in accordance with an embodiment of the present invention.
Figure 16:
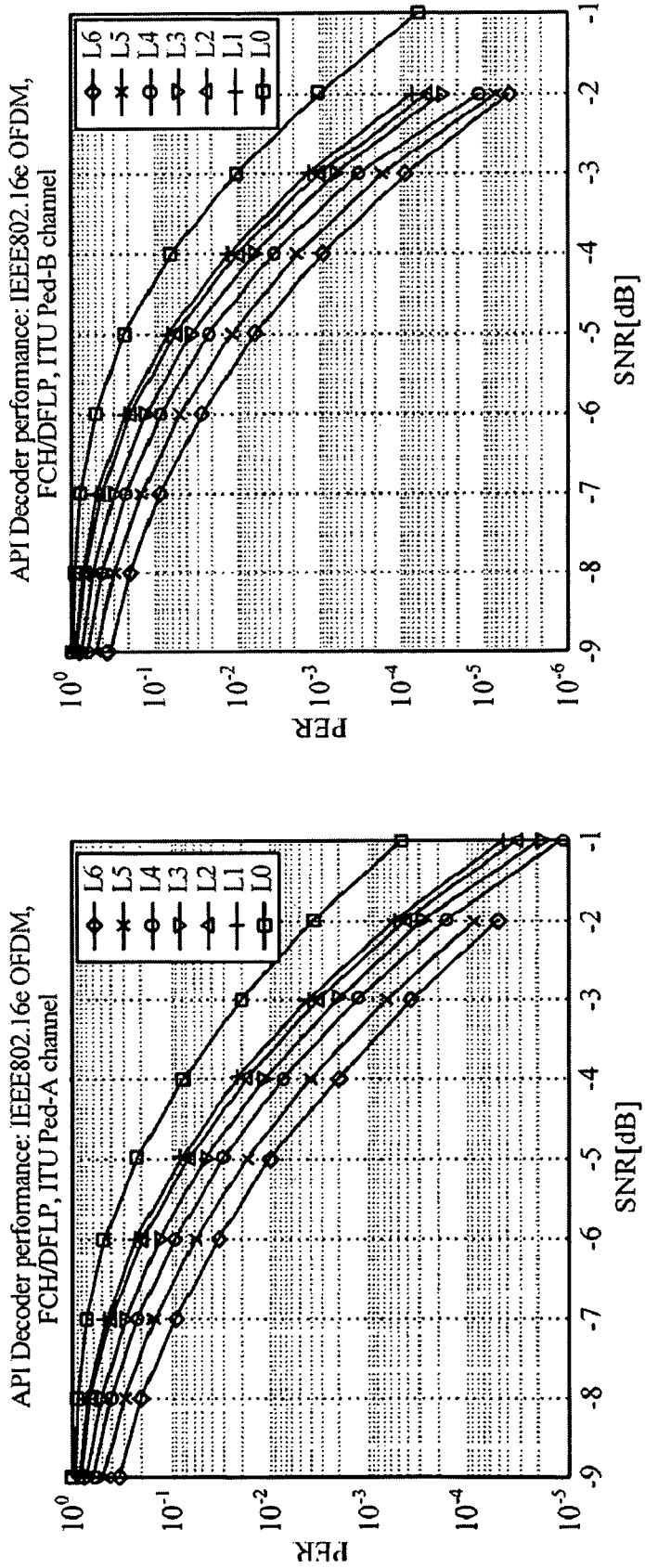
FIG. 16 illustrate example results of decoding for different API hypotheses, in accordance with an embodiment of the present invention.
Figure 17:
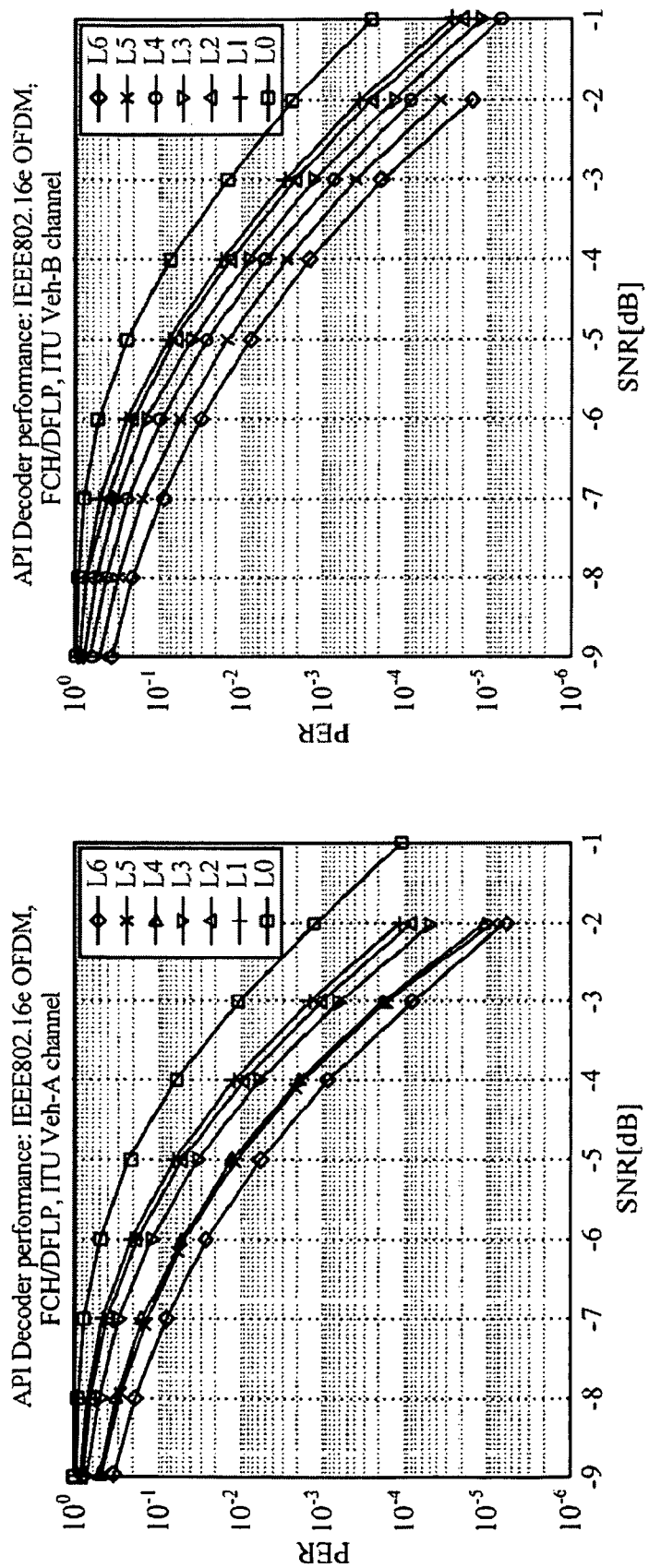
FIG. 17 illustrate example results of decoding for different API hypotheses, in accordance with an embodiment of the present invention.

As described above, the API bit values according to these different hypotheses may be used by the API decoder to remove decoding paths that correspond to erroneous data. Because the different hypotheses have different API bit values, the decoding performance may vary from hypothesis to hypothesis. FIGS. 15-17 show example graphs that illustrate the performance variations between the different hypotheses over different channels.

FIG. 15 shows simulation results of API decoding for different hypotheses L0-L6 in an additive white Gaussian noice (AWGN) channel. In the simulation, it is assumed that all hypotheses are correct (in other words, it is assumed that the API bit values match the actual encoded bit values).

As illustrated, hypotheses with more API bits yield better performance (reduced bit error rates). FIG. 16 shows similar results, for API decoding using the different hypothesis for ITU Ped-A and Ped-B channels. FIG. 17 shows similar results, for API decoding using the different hypothesis for ITU Veh-A and Veh-B channels.

As used herein, the term "determining" encompasses a wide variety of actions. For example, "determining" may include calculating, computing, processing, deriving, investigating, looking up (e.g., looking up in a table, a database or another data structure), ascertaining and the like, and vice versa. Also, "determining" may include receiving (e.g., receiving information), accessing (e.g., accessing data in a memory) and the like. Also, "determining" may include resolving, selecting, choosing, establishing and the like, and vice versa.

Information and signals may be represented using any of a variety of different technologies and techniques. For example, data, instructions, commands, information, signals and the like that may be referenced throughout the above description may be represented by voltages, currents, electromagnetic waves, magnetic fields or particles, optical fields or particles or any combination thereof.

The various illustrative logical blocks, modules and circuits described in connection with the present disclosure may be implemented or performed with a general purpose processor, a digital signal processor (DSP), an application specific integrated circuit (ASIC), a field programmable gate array signal (FPGA) or other programmable logic device, discrete gate or transistor logic, discrete hardware components or any combination thereof designed to perform the functions described herein. A general purpose processor may be a microprocessor, but in the alternative, the processor may be any commercially available processor, controller, microcontroller or state machine. A processor may also be implemented as a combination of computing devices, e.g., a combination of a DSP and a microprocessor, a plurality of microprocessors, one or more microprocessors in conjunction with a DSP core or any other such configuration.

The steps of a method or algorithm described in connection with the present disclosure may be embodied directly in hardware, in a software module executed by a processor or in a combination of the two. A software module may reside in any form of storage medium that is known in the art. Some examples of storage media that may be used include RAM memory, flash memory, ROM memory, EPROM memory, EEPROM memory, registers, a hard disk, a removable disk, a CD-ROM and so forth. A software module may comprise a single instruction, or many instructions, and may be distributed over several different code segments, among different programs and across multiple storage media. A storage medium may be coupled to a processor such that the processor can read information from, and write information to, the storage medium. In the alternative, the storage medium may be integral to the processor.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in software, the functions may be stored as one or more instructions on a computer-readable medium. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

Further, it should be appreciated that modules and/or other appropriate means for performing the methods and techniques described herein can be downloaded and/or otherwise obtained by a mobile device and/or base station as applicable. For example, such a device can be coupled to a server to facilitate the transfer of means for performing the methods described herein. Alternatively, various methods described herein can be provided via a storage means (e.g., random access memory (RAM), read only memory (ROM), a physical storage medium such as a compact disc (CD) or floppy disk, etc.), such that a mobile device and/or base station can obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the methods and apparatus described above without departing from the scope of the claims.

While the foregoing is directed to embodiments of the present invention, other and further embodiments of the invention may be devised without departing from the basic scope thereof, and the scope thereof is determined by the claims that follow.

While the foregoing is directed to embodiments of the present invention, other and further embodiments of the invention may be devised without departing from the basic scope thereof, and the scope thereof is determined by the claims that follow.

What is claimed is:

1. A method for decoding encoded data bits of a wireless communication transmission, comprising:
    generating a set of a-priori bit values including one or more known decoded bit values of the encoded data bits, wherein the known decoded bit values are known prior to decoding;
    removing, from a collection of possible decoding paths, decoding paths that correspond to decoded data bits that are inconsistent with the set of a-priori bit values; and
    decoding the encoded data bits by selecting a decoding path from remaining decoding paths of the possible decoding paths that were not removed.

2. The method of claim 1, wherein generating the set of a-priori bit values comprises generating a set of bit values based on a limited number of coding schemes supported by a wireless communications system.

3. The method of claim 1, wherein generating the set of a-priori bit values comprises generating a set of bits corresponding to a length field of a message based on an assumption regarding a length of the message.

4. The method of claim 1, further comprising: generating a set of mask bits that indicates whether at least one value from the set of a-priori bit values is to be considered when removing decoding paths.

5. The method of claim 1, wherein removing decoding paths that correspond to decoded data bits that are inconsistent with the set of a-priori bit values comprises adjusting branch metrics for state transitions that correspond to bit values inconsistent with the set of a-priori bit values.

6. A decoder for decoding encoded data bits of a wireless communication transmission, comprising:
    a branch metric unit for calculating branch metrics of the encoded data bits;
    an add-compare-select unit for selecting, based on the branch metrics, a decoding path for use in generating decoded bits; and
    logic for removing, from consideration by the add-compare-select unit when selecting the decoding path, one or more decoding paths that correspond to decoded bit values that are inconsistent with a set of one or more a-priori bit values that include one or more known decoded bit values of the encoded data bits, wherein the known decoded bit values are known prior to decoding.

7. The decoder of claim 6, wherein the logic for removing comprises logic configured to alter branch metrics corresponding to bit values that are inconsistent with the one or more a-priori bit values.

8. The decoder of claim 7, wherein altering the branch metrics corresponding to bit values that are inconsistent with the one or more a-priori bit values comprises assigning worst-case values to the altered branch metrics.

9. The decoder of claim 6, wherein the logic for removing receives an indication of the one or more a-priori bit values and an indication of corresponding bit locations within the decoded data bits.

10. The decoder of claim 6, wherein the logic for removing receives mask bits that indicate whether at least one value from the set of a-priori bit values should be ignored.

11. The decoder of claim 6, wherein the decoder is a Viterbi decoder.

12. The decoder of claim 6, wherein the decoder is configured to decode data encoded with a systematic code.

13. A receiver for wireless communication, comprising:
a receiver front end for receiving a wireless transmission and generating a set of encoded bits; and
a decoder configured to decode the encoded bits by removing, from a collection of possible decoding paths, decoding paths that correspond to decoded data bits that are inconsistent with a set of a-priori bit values that include one or more known decoded values of the encoded bits, wherein the known decoded values are known prior to decoding, and selecting a decoding path from remaining decoding paths of the possible decoding paths that were not removed.

14. The receiver of claim 13, further comprising: logic for generating the set of a-priori bit values based on message information provided by a message processor.

15. The receiver of claim 14, wherein the logic for generating the set of a-priori bit values is configured to generate a plurality of sets of a-priori bit values, of which the set of a-priori bit values is one, wherein at least two of the plurality of sets of a-priori bit values have a different number of bits with specified values.

16. The receiver of claim 13, wherein the logic is configured to specify at least one value from the set of a-priori bit values based on at least one bit value from a previously received transmission.

17. The receiver of claim 16, wherein the previously received transmission comprises a downlink frame prefix (DLFP) message.

18. The receiver of claim 13, wherein the decoder is a Viterbi decoder.

19. An apparatus for wireless communications, comprising:
means for receiving a wireless transmission and generating a set of encoded bits; and
means for decoding the encoded bits by removing, from a collection of possible decoding paths, decoding paths that correspond to decoded data bits that are inconsistent with a set of a-priori bit values that include one or more known decoded values of the encoded bits, wherein the known decoded values are known prior to decoding, and selecting a decoding path from remaining decoding paths of the possible decoding paths that were not removed.

20. The apparatus of claim 19, wherein the means for decoding comprises means for altering branch metrics corresponding to bit values that are inconsistent with the one or more a-priori bit values.

21. A computer-program product for wireless communications comprising a computer readable medium having a set of instructions stored thereon, the set of instructions being executable by one or more processors and the set of instructions comprising:
instructions for receiving a wireless transmission and generating a set of encoded bits; and
instructions for decoding the encoded bits by removing, from a collection of possible decoding paths, decoding paths that correspond to decoded data bits that are inconsistent with a set of a-priori bit values that include one or more known decoded values of the encoded bits, wherein the known decoded values are known prior to decoding, and selecting a decoding path from remaining decoding paths of the possible decoding paths that were not removed.

22. The computer-program product of claim 21, wherein the instructions for decoding comprises instructions for altering branch metrics corresponding to bit values that are inconsistent with the one or more a-priori bit values.

23. A computer-program product for decoding encoded data bits of a wireless communication transmission comprising a computer readable medium having a set of instructions stored thereon, the set of instructions being executable by one or more processors and the set of instructions comprising:
instructions for generating a set of a-priori bit values including one or more known decoded bit values of the encoded data bits, wherein the known decoded bit values are known prior to decoding;
instructions for removing, from a collection of possible decoding paths, decoding paths that correspond to decoded data bits that are inconsistent with the set of a-priori bit values; and
instructions for decoding the encoded data bits by selecting a decoding path from remaining decoding paths of the possible decoding paths that were not removed.

24. The computer-program product of claim 23, wherein the instructions for generating the set of a-priori bit values comprises instructions for generating a set of bit values based on a limited number of coding schemes supported by a wireless communications system.

25. The computer-program product of claim 23, wherein the instructions for generating the set of a-priori bit values comprises instructions for generating a set of bits corresponding to a length field of a message based on an assumption regarding a length of the message.

26. The computer-program product of claim 23, further comprising: instructions for generating a set of mask bits that indicates whether at least one value from the set of a-priori bit values is to be considered when removing decoding paths.

27. The computer-program product of claim 23, wherein the instructions for removing decoding paths that correspond to decoded data bits that are inconsistent with the set of a-priori bit values comprises instructions for adjusting branch metrics for state transitions that correspond to bit values inconsistent with the set of a-priori bit values.

28. An apparatus for decoding encoded data bits of a wireless communication transmission, comprising:
means for generating a set of a-priori bit values including one or more known decoded bit values of the encoded data bits, wherein the known decoded bit values are known prior to decoding;
means for removing, from a collection of possible decoding paths, decoding paths that correspond to decoded data bits that are inconsistent with the set of a-priori bit values; and
means for decoding the encoded data bits by selecting a decoding path from remaining decoding paths of the possible decoding paths that were not removed.

29. The apparatus of claim 28, wherein the means for generating the set of a-priori bit values comprises means for generating a set of bit values based on a limited number of coding schemes supported by a wireless communications system.

30. The apparatus of claim 28, wherein the means for generating the set of a-priori bit values comprises means for generating a set of bits corresponding to a length field of a message based on an assumption regarding a length of the message.

31. The apparatus of claim 28, further comprising: means for generating a set of mask bits that indicates whether at least one value from the set of a-priori bit values is to be considered when removing decoding paths.

32. The apparatus of claim 28, wherein the means for removing decoding paths that correspond to decoded data bits that are inconsistent with the set of a-priori bit values comprises means for adjusting branch metrics for state transitions that correspond to bit values inconsistent with the set of a-priori bit values.

* * * * *